United States Patent
Lee et al.

(10) Patent No.: US 7,999,468 B2
(45) Date of Patent: Aug. 16, 2011

(54) DISPLAY DEVICE HAVING SEALANT AND BEZEL AREA

(75) Inventors: Jaehyuk Lee, Seoul (KR); Seungho Kwon, Seoul (KR); Hongmo Koo, Seoul (KR)

(73) Assignee: LG Electronics Inc., Seoul (KR)

( * ) Notice: Subject to any disclaimer, the term of this patent is extended or adjusted under 35 U.S.C. 154(b) by 259 days.

(21) Appl. No.: 12/026,228

(22) Filed: Feb. 5, 2008

(65) Prior Publication Data

US 2009/0015136 A1    Jan. 15, 2009

(30) Foreign Application Priority Data

Jul. 12, 2007   (KR) .......................... 10-2007-0070138

(51) Int. Cl.
  *H01J 1/62*     (2006.01)
  *H01J 63/04*    (2006.01)
(52) U.S. Cl. ........................ 313/512; 313/505
(58) Field of Classification Search .............. 313/512, 313/505
See application file for complete search history.

(56) References Cited

U.S. PATENT DOCUMENTS

| | | | | |
|---|---|---|---|---|
| 6,317,186 B1 * | 11/2001 | Miwa et al. | ................... | 349/153 |
| 6,840,833 B1 * | 1/2005 | Motowaki et al. | ............... | 445/25 |
| 7,151,585 B2 * | 12/2006 | Asakawa | ..................... | 349/153 |
| 2006/0082298 A1 | 4/2006 | Becken et al. | ................. | 313/512 |
| 2006/0087217 A1 * | 4/2006 | Kijima et al. | ................. | 313/493 |
| 2007/0128966 A1 * | 6/2007 | Becken et al. | .................. | 445/25 |
| 2007/0128967 A1 * | 6/2007 | Becken et al. | .................. | 445/25 |
| 2007/0228937 A1 * | 10/2007 | Akiyoshi | ....................... | 313/503 |
| 2008/0079880 A1 * | 4/2008 | Mochizuki et al. | ........... | 349/122 |
| 2008/0111479 A1 * | 5/2008 | Choi et al. | .................... | 313/504 |
| 2009/0066242 A1 * | 3/2009 | Koo | .............................. | 313/506 |

FOREIGN PATENT DOCUMENTS

| | | |
|---|---|---|
| KR | 10-2005-0119277 A | 12/2005 |
| WO | WO 2006064715 A1 * | 6/2006 |

OTHER PUBLICATIONS

Korean Office Action dated May 29, 2008.

* cited by examiner

*Primary Examiner* — Peter J Macchiarolo
*Assistant Examiner* — Glenn Zimmerman
(74) *Attorney, Agent, or Firm* — KED & Associates, LLP

(57) ABSTRACT

A display device is disclosed. The display device includes a first substrate, a light emitting unit on the first substrate, a second substrate on the light emitting unit, and a seal member that attaches the first substrate to the second substrate. The light emitting unit includes a first electrode, a light emitting layer, and a second electrode. The seal member includes a straight portion and a curved portion. A radius of curvature of the curved portion lies substantially in a range between 0.2 mm and 2.5 mm.

2 Claims, 8 Drawing Sheets

DISPLAY DEVICE HAVING SEALANT AND BEZEL AREA

This application claims the benefit of Korean Patent Application No. 10-2007-0070138 filed on Jul. 12, 2007, which is hereby incorporated by reference.

BACKGROUND OF THE DISCLOSURE

1. Field of the Disclosure

An exemplary embodiment relates to a display device.

2. Description of the Related Art

The importance of flat panel displays has recently increased with the growth of multimedia. Various types of flat panel displays such as liquid crystal displays (LCDs), plasma display panels (PDPs), field emission displays (FEDs), and organic light emitting devices have been put to practical use.

In particular, an organic light emitting device may have a high response speed (of 1 ms or less), a low power consumption, and a self-emitting structure. The organic light emitting device does not have viewing problems, and thus can used as a moving picture display device regardless of the size of device. Further, since the organic light emitting device can be manufactured at a low temperature using a simple manufacturing process based on an existing semiconductor process technology, the organic light emitting device has been considered as a next generation display device.

The organic light emitting device has a self-emitting structure due to a light emitting layer including an organic material. The organic material may be easily deteriorated due to moisture and oxygen permeating from the outside. Therefore, the organic light emitting device may attempt to prevent the organic material of the light emitting layer from being deteriorated.

For instance, the organic light emitting device may use a seal member to attach a first substrate, on which a light emitting unit including a first electrode, a light emitting layer and a second electrode is positioned, to a second substrate. When the seal member is provided along an outer edge of the light emitting unit, the seal member may have a straight portion and a curved portion. Because process specifications of the straight portion and the curved portion of the seal member are not uniform, the seal member may be pushed out or introduced into the light emitting unit when the first substrate is attached to the second substrate. This may reduce an area of the light emitting unit or may extend a bezel area outside the organic light emitting device.

SUMMARY OF THE DISCLOSURE

An exemplary embodiment provides a display device capable of improving seal characteristics and reliability by defining a process specification of a seal member used to attach a first substrate to a second substrate.

In one aspect, a display device comprises a first substrate, a light emitting unit on the first substrate, the light emitting unit including a first electrode, a light emitting layer, and a second electrode, a second substrate on the light emitting unit, and a seal member that attaches the first substrate to the second substrate, the seal member including a straight portion and a curved portion, wherein a radius of curvature of the curved portion lies substantially in a range between 0.2 mm and 2.5 mm.

In another aspect, a display device comprises a first substrate, a light emitting unit on the first substrate, the light emitting unit including a first electrode, a light emitting layer, and a second electrode, a second substrate on the light emitting unit, and a seal member that attaches the first substrate to the second substrate, the seal member including a straight portion and a curved portion, wherein a ratio of a width of the straight portion to a width of the curved portion lies substantially in a range between 1:1 and 1:1.5.

BRIEF DESCRIPTION OF THE DRAWINGS

The accompanying drawings, which are included to provide a further understanding of the invention and are incorporated on and constitute a part of this specification, illustrate embodiments of the invention and together with the description serve to explain the principles of the invention. In the drawings.

DETAILED DESCRIPTION OF EMBODIMENTS

Reference will now be made in detail embodiments of the invention examples of which are illustrated in the accompanying drawings.

Figure 1:
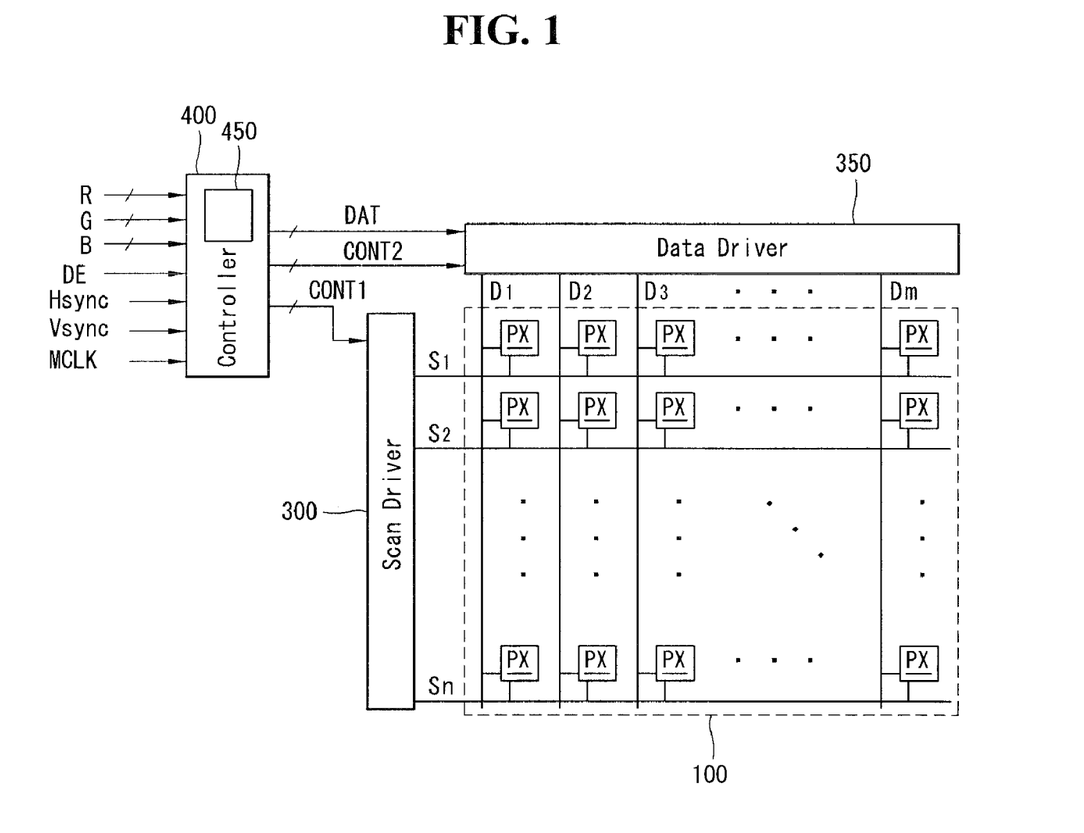
FIG. 1 is a bock diagram of a display device according to an exemplary embodiment.
Figure 2:
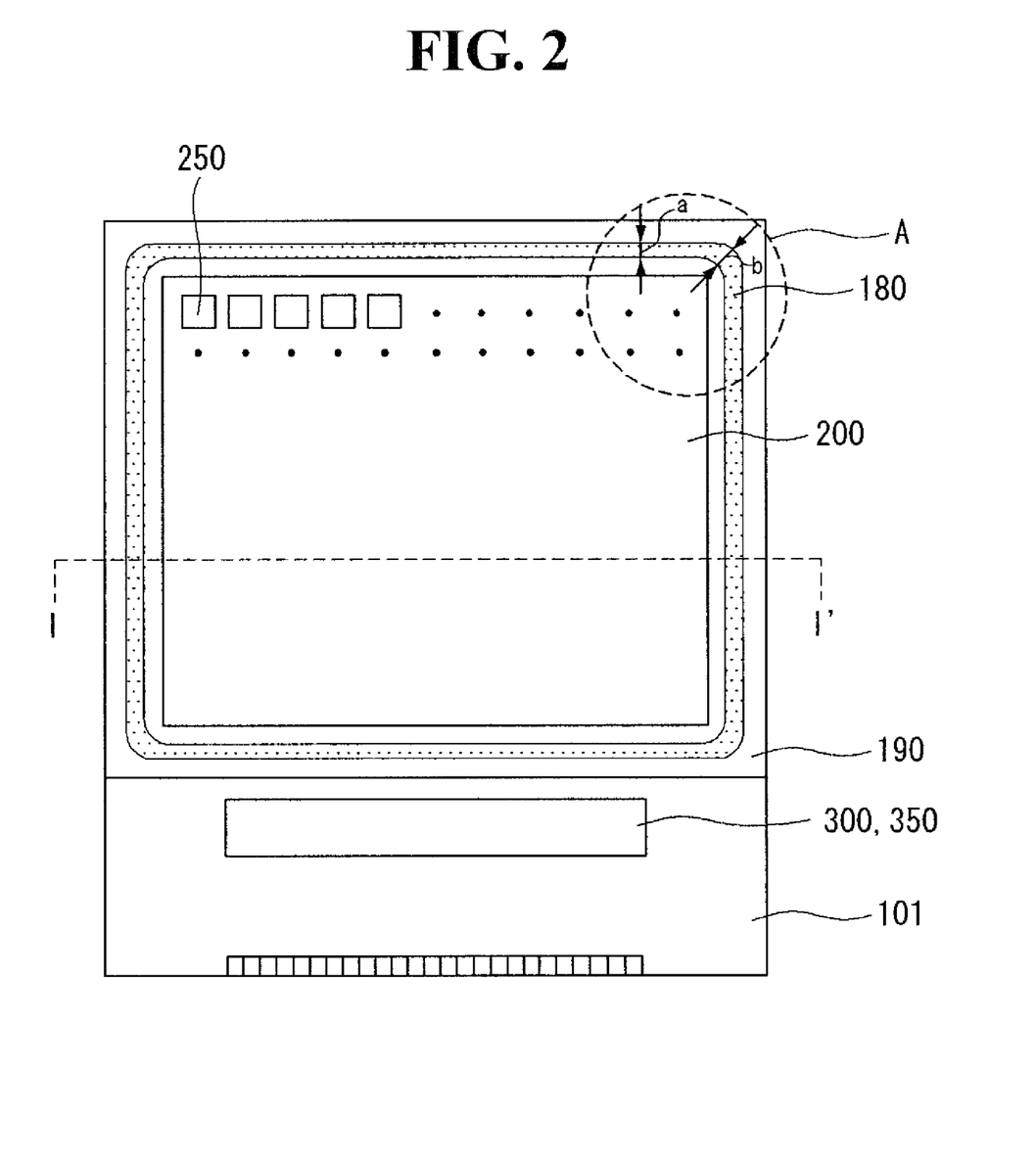
FIG. 2 is a plane view of the display device.
Figure 3A:
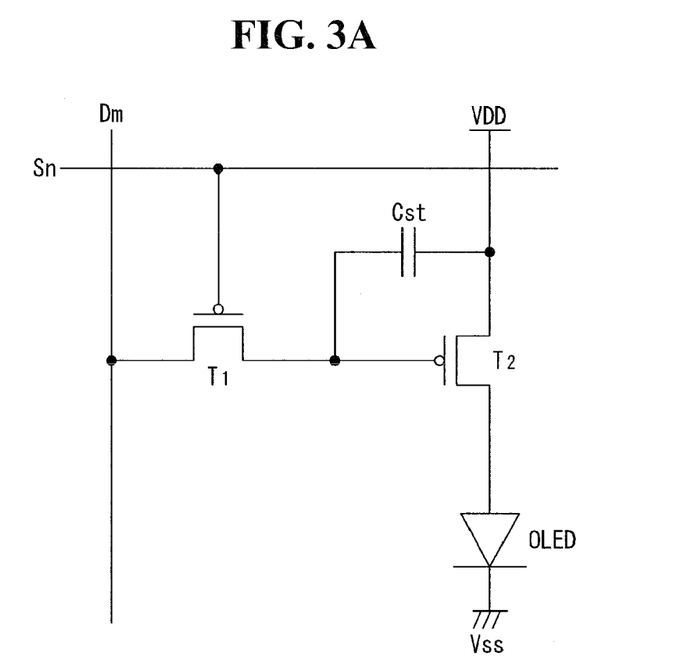
FIGS. 3A and 3B are circuit diagrams of a subpixel of the display device.
Figure 3B:
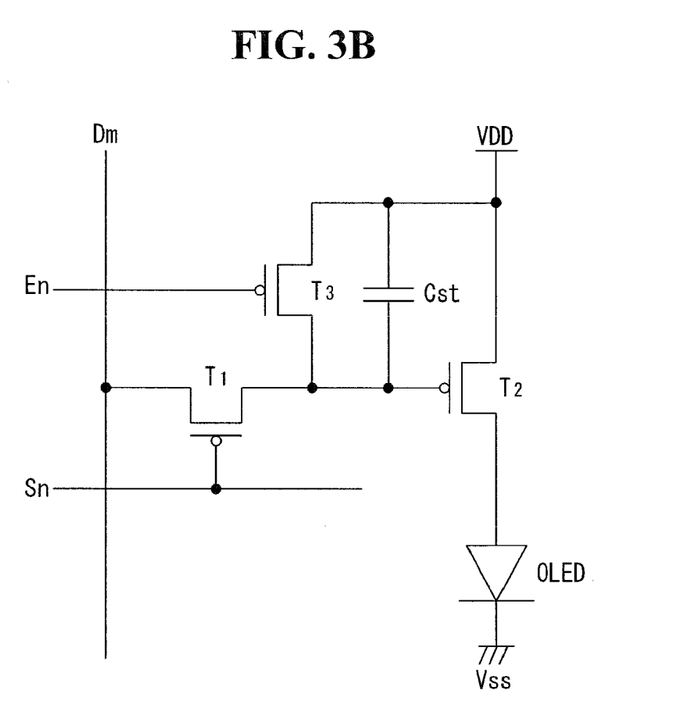

FIG. 1 is a bock diagram of a display device according to an exemplary embodiment, FIG. 2 is a plane view of the display device, and FIGS. 3A and 3B are circuit diagrams of a subpixel of the display device.

As shown in FIG. 1, the display device according to the exemplary embodiment includes a display panel 100, a scan driver 300, a data driver 350, and a controller 400.

The display panel 100 includes a plurality of signal lines S1 to Sn and D1 to Dm, a plurality of power supply lines (not shown), and a plurality of subpixels PX arranged in a matrix format to be connected to the signal lines S1 to Sn and D1 to Dm and the power supply lines.

The plurality of signal lines S1 to Sn and D1 to Dm may include the plurality of scan lines S1 to Sn for transmitting scan signals and the plurality of data lines D1 to Dm for transmitting data signals. Each power supply line may transmit voltages such as a first power voltage VDD, a second power voltage Vss to each subpixel PX.

Although the signal lines include the scan lines S1 to Sn and the data lines D1 to Dm in FIG. 1, the exemplary embodiment is not limited thereto. The signal lines may further include erase lines (not shown) for transmitting erase signals depending on a driving manner.

However, the erase lines may not be used to transmit the erase signals. The erase signal may be transmitted through another signal line. For instance, although it is not shown, the erase signal may be supplied to the display panel 100 through the power supply line in case that the power supply line for supplying the first power voltage VDD is formed.

As shown in FIG. 3A, the subpixel PX may include a switching thin film transistor T1 transmitting a data signal in response to a scan signal transmitted through the scan line Sn, a capacitor Cst storing the data signal, a driving thin film transistor T2 producing a driving current corresponding to a voltage difference between the data signal stored in the capacitor Cst and the first power voltage VDD, and an organic light emitting diode (OLED) emitting light corresponding to the driving current.

As shown in FIG. 3B, the subpixel PX may include a switching thin film transistor T1 transmitting a data signal in response to a scan signal transmitted through the scan line Sn, a capacitor Cst storing the data signal, a driving thin film transistor T2 producing a driving current corresponding to a voltage difference between the data signal stored in the capacitor Cst and the first power voltage VDD, an organic light emitting diode (OLED) emitting light corresponding to the driving current, and an erase switching thin film transistor T3 erasing the data signal stored in the capacitor Cst in response to an erase signal transmitted through an erase line En.

When the display device is driven in a digital driving manner that represents a gray scale by dividing one frame into a plurality of subfields, the pixel circuit of FIG. 3B can control a light emitting time by supplying the erase signal to the subfield PX whose the light-emission time is shorter than an addressing time. The pixel circuit of FIG. 3B has an advantage capable of reducing a minimum luminance of the display device.

A difference between driving voltages, e.g., the first and second power voltages VDD and Vss of the display device may change depending on the size of the display panel 100 and a driving manner. A magnitude of the driving voltage is shown in the following Tables 1 and 2. Table 1 indicates a driving voltage magnitude in case of a digital driving manner, and Table 2 indicates a driving voltage magnitude in case of an analog driving manner.

TABLE 1

| Size (S) of display panel | VDD-Vss (R) | VDD-Vss (G) | VDD-Vss (B) |
|---|---|---|---|
| S < 3 inches | 3.5-10 (V) | 3.5-10 (V) | 3.5-12 (V) |
| 3 inches < S < 20 inches | 5-15 (V) | 5-15 (V) | 5-20 (V) |
| 20 inches < S | 5-20 (V) | 5-20 (V) | 5-25 (V) |

TABLE 2

| Size (S) of display panel | VDD-Vss (R, G, B) |
|---|---|
| S < 3 inches | 4~20 (V) |
| 3 inches < S < 20 inches | 5~25 (V) |
| 20 inches < S | 5~30 (V) |

Referring again to FIG. 1, the scan driver 300 is connected to the scan lines S1 to Sn to apply scan signals capable of turning on the switching thin film transistor T1 to the scan lines S1 to Sn, respectively.

The data driver 350 is connected to the data lines D1 to Dm to apply data signals indicating an output video signal DAT' to the data lines D1 to Dm, respectively. The data driver 350 may include at least one data driving integrated circuit (IC) connected to the data lines D1 to Dm.

The data driving IC may include a shift register, a latch, a digital-to-analog (DA) converter, and an output buffer which are connected to one another in the order named.

When a horizontal sync start signal (STH) (or a shift clock signal) is received, the shift register can transmit the output video signal DAT' to the latch in response to a driving ICs, a shift register of a data driving IC can transmit a shift clock signal to a shift register of a next data driving IC.

The latch memorizes the output video signal DAT', selects a gray voltage corresponding to the memorized output video signal DAT' in response to a load signal, and transmits the gray voltage to the output buffer.

The DA converter selects the corresponding gray voltage in response to the output video signal DAT' and transmits the gray voltage to the output buffer.

The output buffer outputs an output voltage (serving as a data signal) received from the DA converter to the data lines D1 to Dm and maintains the output of the output voltage for 1 horizontal period (1 H).

The controller 400 controls operations of the scan driver 300 and the data driver 350. The controller 400 may include a signal conversion unit 450 that gamma-converts input video signals R, G and B into the output video signal DAT' and produces the output video signal DAT'.

The controller 400 produces a scan control signal CONT1 and a data control signal CONT2, and the like. Then, the controller 400 outputs the scan control signal CONT1 to the scan driver 300 and outputs the data control signal CONT2 and the processed output video signal DAT' to the data driver 350.

The controller 400 receives the input video signals R, G and B and an input control signal for controlling the display of the input video signals R, G and B from a graphic controller (not shown) positioned outside the display device. Examples of the input control signal include a vertical sync signal Vsync, a horizontal sync signal Hsync, a main clock signal MCLK and a data enable signal DE.

Each of the driving devices 300, 350 and 400 may be directly mounted on the display panel 100 in the form of at least one IC chip, or may be attached to the display panel 100 in the form of a tape carrier package (TCP) in a state where the driving devices 300, 350 and 400 each are mounted on a flexible printed circuit film (not shown), or may be mounted on a separate printed circuit board (not shown). Alternatively, each of the driving devices 300, 350 and 400 may be integrated on the display panel 100 together with elements such as the plurality of signal lines S1 to Sn and D1 to Dm or the thin film transistors T1, T2 and T3.

Further, the driving devices 300, 350 and 400 may be integrated into a single chip. In this case, at least one of the driving devices 300, 350 and 400 or at least one circuit element constituting the driving devices 300, 350 and 400 may be positioned outside the single chip.

As shown in FIG. 2, the display device according to the exemplary embodiment includes a first substrate 101, a second substrate 190 facing the first substrate 101, a light emitting unit 200 on the first substrate 101, a plurality of subpixels 250 inside the light emitting unit 200, a seal member 180 positioned around the light emitting unit 200, and the drivers 300 and 350.

The light emitting unit 200 may be used as an image display area and may include the plurality of subpixels 250.

The drivers 300 and 350 may apply signals to the light emitting unit 200 and may be mounted as a chip-on-glass (COG) type of driver.

The seal member 180 may attach the first substrate 101 to the second substrate 190 to seal the light emitting unit 200. The seal member 180 may be a sealant or a frit. The sealant may use acrylic resin or other materials.

The frit may be made of a material that has seal properties indicating an oxygen vapor permeation rate of $10^{-3}$ g/m$^2$/day and a water vapor permeation rate of $10^{-6}$ g/m$^2$/day and is capable of curing by infrared (IR) irradiation. Examples of the material include $Bi_2O_3$, $SiO_2$, $B_2O_3$, PbO or other materials as a principal component.

The frit may include at least one filler or at least one additive. The filler or the additive may adjust a thermal expansion characteristic of the seal member and an absorption characteristic depending on a selected frequency. The filler or the additive may include a transition metal such as chromium (Cr), iron (Fe), manganese (Mn), cobalt (Co), copper (Cu), and vanadium (V). The filler or the additive may further include $ZnSiO_4$, $PbTiO_3$, $ZrO_2$, eucryptite.

The seal member 180 on the first substrate 101 may include a straight portion and a curved portion. The straight portion may be formed by coating a surrounding portion of the light emitting unit 200 in a straight shape, and the curved portion may be formed by coating edges of the light emitting unit 200 in a curved shape.

A ratio of a width of the straight portion to a width of the curved portion of the seal member 180 may lie substantially in a range between 1:1 and 1:1.5. When the ratio is equal to or more than 1:1, a reduction in an adhesive strength of the curved portion can be prevented and a process condition of controlling a discharge amount of the seal member 180 can be easily secured.

When the ratio is equal to or less than 1:1.5, a problem of an increased bezel area of the display panel may be solved and/or minimized due to an increase in the width of the curved portion, and thus a problem of a panel size increasing can be solved and/or minimized.

Figure 4:
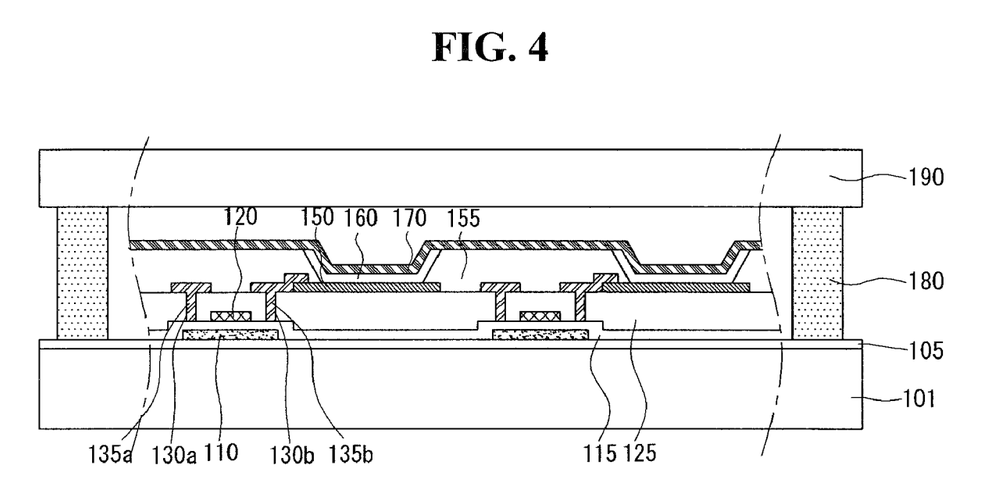
FIG. 4 is a cross-sectional view taken along line I-I' of FIG. 2.

FIG. 4 is a cross-sectional view taken along line I-I' of FIG. 2. More specifically, FIG. 4 shows a subpixel constituting the light emitting unit 200.

As shown in FIG. 4A, a buffer layer 105 is positioned on the first substrate 101. The buffer layer 105 prevents impurities (e.g., alkali ions discharged from the first substrate 101) from being introduced during formation of the thin film transistor in a succeeding process. The buffer layer 105 may be selectively formed using silicon oxide ($SiO_2$), silicon nitride ($SiN_x$), or using other materials.

A semiconductor layer 110 is positioned on the buffer layer 105. The semiconductor layer 110 may be formed of amorphous silicon or crystallized polycrystalline silicon. Although it is not shown, the semiconductor layer 110 may include a channel region, a source region, and a drain region, and the source region and the drain region may be doped with p-type or n-type impurities.

A gate insulating film 115 may be positioned on the first substrate 101 including the semiconductor layer 110. The gate insulating film 115 may be selectively formed using silicon oxide ($SiO_2$), silicon nitride ($SiN_x$), or using other materials.

A gate electrode 120 may be positioned on the gate insulating film 115 in a given area of the semiconductor layer 110, e.g., at a location corresponding to the channel region of the semiconductor layer 110 when impurities are doped. The gate electrode 120 may include any one of aluminum (Al), Al alloy, titanium (Ti), silver (Ag), molybdenum (Mo), Mo alloy, tungsten (W), and tungsten silicide ($WSi_2$).

An interlayer insulating film 125 may be positioned on the first substrate 101 including the gate electrode 120. The interlayer insulating film 125 may be an organic film, an inorganic film, or a composite film of the organic film and the inorganic film.

In case that the interlayer insulating film 125 is an inorganic film, the interlayer insulating film 125 may include silicon oxide ($SiO_2$), silicon nitride ($SiN_x$), or silicate-on-glass (SOG). In case that the interlayer insulating film 125 is an organic film, the interlayer insulating film 125 may include acrylic resin, polyimide resin, or benzocyclobutene (BCB) resin. The interlayer insulating film 125 is not limited to the above materials.

Contact holes 130a and 130b may pass through the interlayer insulating film 125 and the gate insulating film 115 to expose a portion of the semiconductor layer 110.

A source electrode 135a and a drain electrode 135b may be electrically connected to the semiconductor layer 110 through the contact holes 130a and 130b. The source and drain electrodes 135a and 135b may include a low resistance material so as to lower a line resistance. For instance, the source and drain electrodes 135a and 135b may have a multi-layered structure including molybdenum tungsten (MoW), Ti, Al or Al alloy. Examples of the multi-layered structure include a stacked structure of Ti/Al/Ti or MoW/Al/MoW. The multi-layered structure is not limited to the above structures.

A first electrode 150 may be electrically connected to the drain electrode 135b. The first electrode 150 may be an anode electrode and include a transparent conductive layer such as indium-tin-oxide (ITO) or indium-zinc-oxide (IZO). The first electrode 150 may have a stacked structure of ITO/Ag/ITO.

A bank layer 155 exposing a portion of the first electrode 150 may be positioned on the first substrate 101 on which the first electrode 150 is positioned. The bank layer 155 may include an organic material such as benzocyclobutene (BCB) resin, acrylic resin, or polyimide resin. The bank layer 155 is not limited to the above materials.

A light emitting layer 160 may be positioned on the exposed portion of the first electrode 150. The light emitting layer 160 may be formed of an organic material. An electron injection layer, an electron transport layer, a hole transport layer, or a hole injection layer may be positioned on or under the light emitting layer 160.

A second electrode 170 may be positioned on the first substrate 101 including the light emitting layer 160. The second electrode 170 may be a cathode electrode for supplying electrons to the light emitting layer 160. The second electrode 170 may include magnesium (Mg), silver (Ag), calcium (Ca), aluminum (Al), or an alloy thereof.

The seal member 180 attaches the first substrate 101 to the second substrate 190, and thus can seal the light emitting unit 200 (refer to FIG. 2).

Figure 5A:
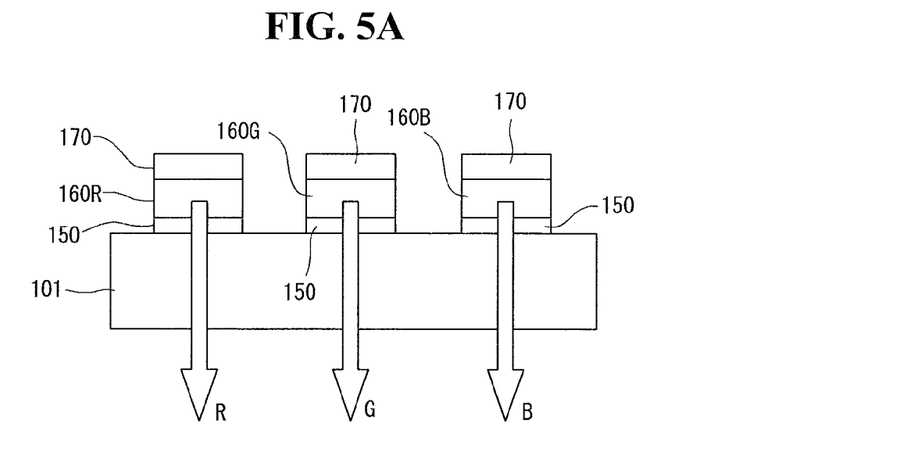
FIGS. 5A to 5C illustrate various implementations of a color image display method in the display device.
Figure 5B:
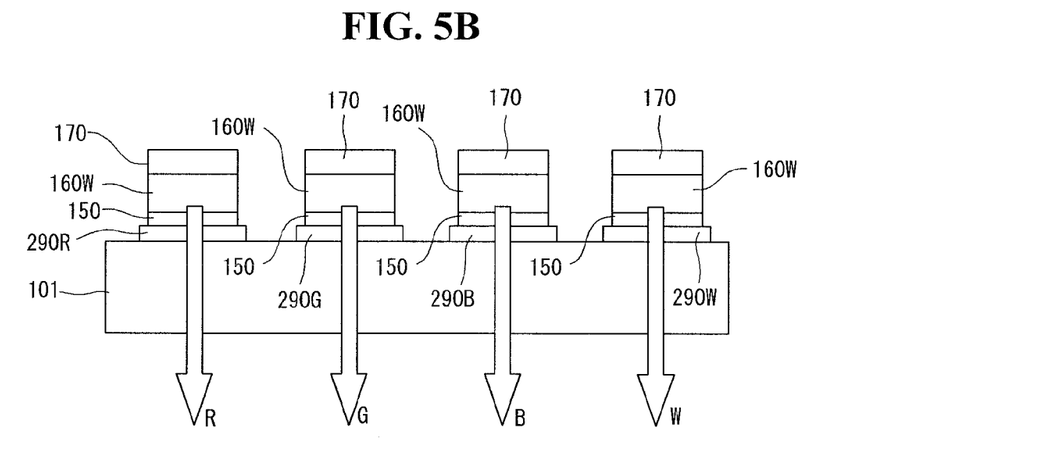
Figure 5C:
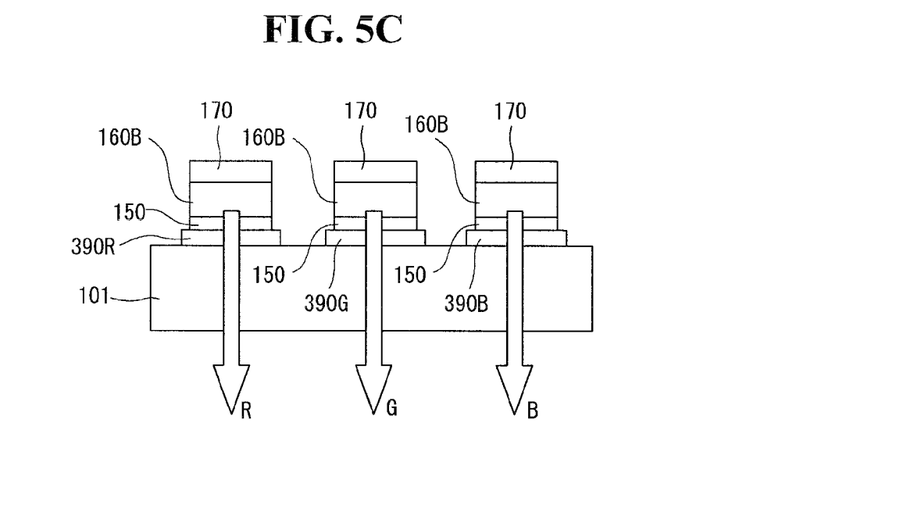

FIGS. 5A to 5C illustrate various implementations of a color image display method in the display device.

FIG. 5A illustrates a color image display method in a display device that separately includes a red light emitting layer 160R to emit red light, a green light emitting layer 160G to emit green light, and a blue light emitting layer 160B to emit blue light. The red, green and blue light produced by the red, green and blue light emitting layers 160R, 160G and 160B is mixed to display a color image.

In FIG. 5A, the red, green and blue light emitting layers 160R, 160G and 160B may each include an electron transport layer, a hole transport layer, and the like. It is possible to variously change an arrangement and a structure between additional layers such as the electron transport layer and the hole transport layer and each of the red, green and blue light emitting layers 160R, 160G and 160B.

FIG. 5B illustrates a color image display method in a display device including a white light emitting layer 160W, a red color filter 290R, a green color filter 290G, a blue color filter 290B, and a white color filter 290W.

As shown in FIG. 5B, the red color filter 290R, the green color filter 290G, the blue color filter 290B, and the white color filter 290W each transmit white light produced by the white light emitting layer 160W and produce red light, green light, blue light, and white light. The red, green, blue, and white light is mixed to display a color image. The white color filter 290W may be removed depending on color sensitivity of the white light produced by the white light emitting layer 160W and combination of the white light and the red, green and blue light.

While FIG. 5B has illustrated the color display method of four subpixels using combination of the red, green, blue, and white light, a color display method of three subpixels using combination of the red, green, and blue light may be used.

In FIG. 5B, the white light emitting layer 160W may include an electron transport layer, a hole transport layer, and the like. It is possible to variously change an arrangement and a structure between additional layers such as the electron transport layer and the hole transport layer and the white light emitting layer 160W.

FIG. 5C illustrates a color image display method in a display device including a blue light emitting layer 160B, a red color change medium 390R, a green color change medium 390G, and a blue color change medium 390B.

As shown in FIG. 5C, the red color change medium 390R, the green color change medium 390G, and the blue color change medium 390B each transmit blue light produced by the blue light emitting layer 160B and produce red light, green light and blue light. The red, green and blue light is mixed to display a color image.

The blue color change medium 390B may be removed depending on color sensitivity of the blue light produced by the blue light emitting layer 160B and combination of the blue light and the red and green light.

In FIG. 5C, the blue light emitting layer 160B may include an electron transport layer, a hole transport layer, and the like. It is possible to variously change an arrangement and a structure between additional layers such as the electron transport layer and the hole transport layer and the blue light emitting layer 160B.

While FIGS. 5A to 5C have illustrated and described the display device having a bottom emission structure, the exemplary embodiment is not limited thereto. The display device according to the exemplary embodiment may have a top emission structure, and thus can a different arrangement and a different structure depending on the top emission structure.

While FIGS. 5A to 5C have illustrated and described three kinds of color image display method, the exemplary embodiment is not limited thereto. The exemplary embodiment may use various kinds of color image display method whenever necessary.

Figure 6:
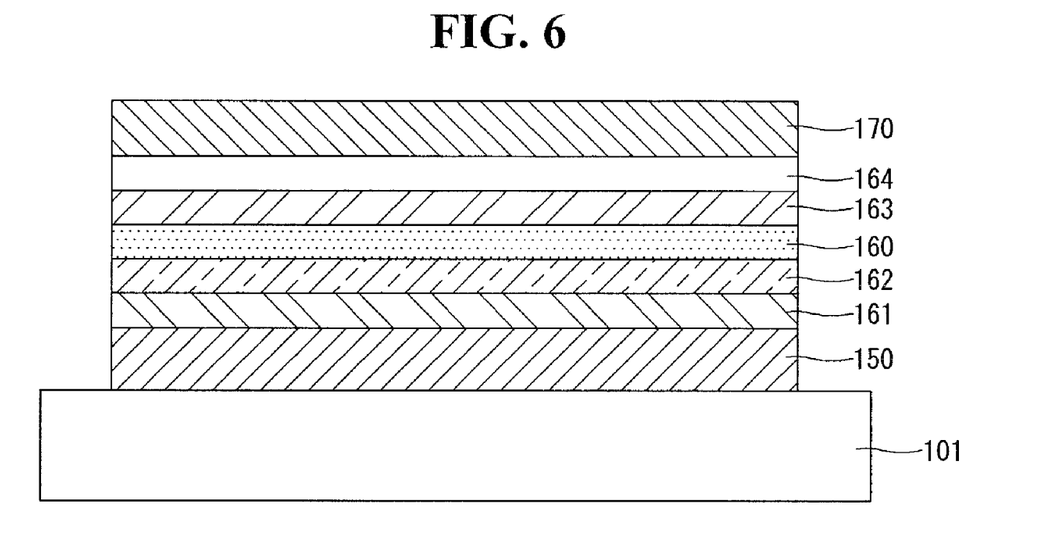
FIG. 6 is a cross-sectional view of the display device.

FIG. 6 is a cross-sectional view of the display device.

As shown in FIG. 6, the display device according to the exemplary embodiment includes the first substrate 101, the first electrode 150 on the first substrate 101, a hole injection layer 161 on the first electrode 150, a hole transport layer 162, the light emitting layer 160, an electron transport layer 163, an electron injection layer 164, and the second electrode 170 on the electron injection layer 164.

The hole injection layer 161 may function to facilitate the injection of holes from the first electrode 150 to the light emitting layer 160. The hole injection layer 161 may be formed of at least one selected from the group consisting of copper phthalocyanine (CuPc), PEDOT(poly(3,4)-ethylenedioxythiophene), polyaniline (PANI) and NPD(N,N-dinaphthyl-N,N'-diphenyl benzidine), but is not limited thereto. The hole injection layer 161 may be formed using an evaporation method or a spin coating method.

The hole transport layer 162 functions to smoothly transport holes. The hole transport layer 162 may be formed from at least one selected from the group consisting of NPD(N,N-dinaphthyl-N,N'-diphenyl benzidine), TPD(N,N'-bis-(3-methylphenyl)-N,N'-bis-(phenyl)-benzidine, s-TAD and MTDATA(4,4',4"-Tris(N-3-methylphenyl-N-phenyl-amino)-triphenylamine), but is not limited thereto. The hole transport layer 162 may be formed using an evaporation method or a spin coating method.

The light emitting layer 160 may be formed of a material capable of producing red, green, blue and white light, for example, a phosphorescence material or a fluorescence material.

In case that the light emitting layer 160 produces red light, the light emitting layer 160 includes a host material including carbazole biphenyl (CBP) or N,N-dicarbazolyl-3,5-benzene (mCP). Further, the light emitting layer 160 may be formed of a phosphorescence material including a dopant material including any one selected from the group consisting of PIQIr (acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP(octaethylporphyrin platinum) or a fluorescence material including PBD:Eu(DBM)3(Phen) or Perylene, but is not limited thereto.

In case that the light emitting layer 160 produces green light, the light emitting layer 160 includes a host material including CBP or mCP. Further, the light emitting layer 160 may be formed of a phosphorescence material including a dopant material including Ir(ppy)3(fac tris(2-phenylpyridine)iridium) or a fluorescence material including Alq3(tris (8-hydroxyquinolino)aluminum), but is not limited thereto.

In case that the light emitting layer 160 produces blue light, the light emitting layer 160 includes a host material including CBP or mCP. Further, the light emitting layer 160 may be formed of a phosphorescence material including a dopant material including (4,6-F2 ppy)2Irpic or a fluorescence material including any one selected from the group consisting of spiro-DPVBi, spiro-6P, distyryl-benzene (DSB), distyrylarylene (DSA), PFO-based polymers, PPV-based polymers and a combination thereof, but is not limited thereto.

The electron transport layer 163 functions to facilitate the transportation of electrons. The electron transport layer 163 may be formed of at least one selected from the group consisting of Alq3(tris(8-hydroxyquinolino)aluminum, PBD, TAZ, spiro-PBD, BAlq, and SAlq, but is not limited thereto. The electron transport layer 163 may be formed using an evaporation method or a spin coating method. The electron transport layer 163 can also function to prevent holes, which are injected from the first electrode 150 and then pass through the light emitting layer 160, from moving to the second electrode 170. In other words, the electron transport layer 163 serves as a hole stop layer, which facilitates the coupling of holes and electrons in the light emitting layer 160.

The electron injection layer 164 functions to facilitate the injection of electrons. The electron injection layer 164 may be formed of Alq3(tris(8-hydroxyquinolino)aluminum), PBD, TAZ, spiro-PBD, BAlq or SAlq, but is not limited thereto. The electron injection layer 164 may be formed of an organic material and an inorganic material forming the electron injection layer 164 through a vacuum evaporation method.

The hole injection layer 161 or the electron injection layer 164 may further include an inorganic material. The inorganic material may further include a metal compound. The metal compound may include alkali metal or alkaline earth metal. The metal compound including the alkali metal or the alkaline earth metal may include at least one selected from the group consisting of LiQ, LiF, NaF, KF, RbF, CsF, FrF, $BeF_2$, $MgF_2$, $CaF_2$, $SrF_2$, $BaF_2$, and $RaF_2$, but is not limited thereto.

Thus, the inorganic material inside the electron injection layer 164 facilitates hopping of electrons injected from the second electrode 170 to the light emitting layer 160, so that holes and electrons injected into the light emitting layer 160 are balanced. Accordingly, the light emission efficiency can be improved.

Further, the inorganic material inside the hole injection layer 161 reduces the mobility of holes injected from the first electrode 150 to the light emitting layer 160, so that holes and electrons injected into the light emitting layer 160 are balanced. Accordingly, the light emission efficiency can be improved.

At least one of the electron injection layer 164, the electron transport layer 163, the hole transport layer 162, the hole injection layer 161 may be omitted.

Figure 7:
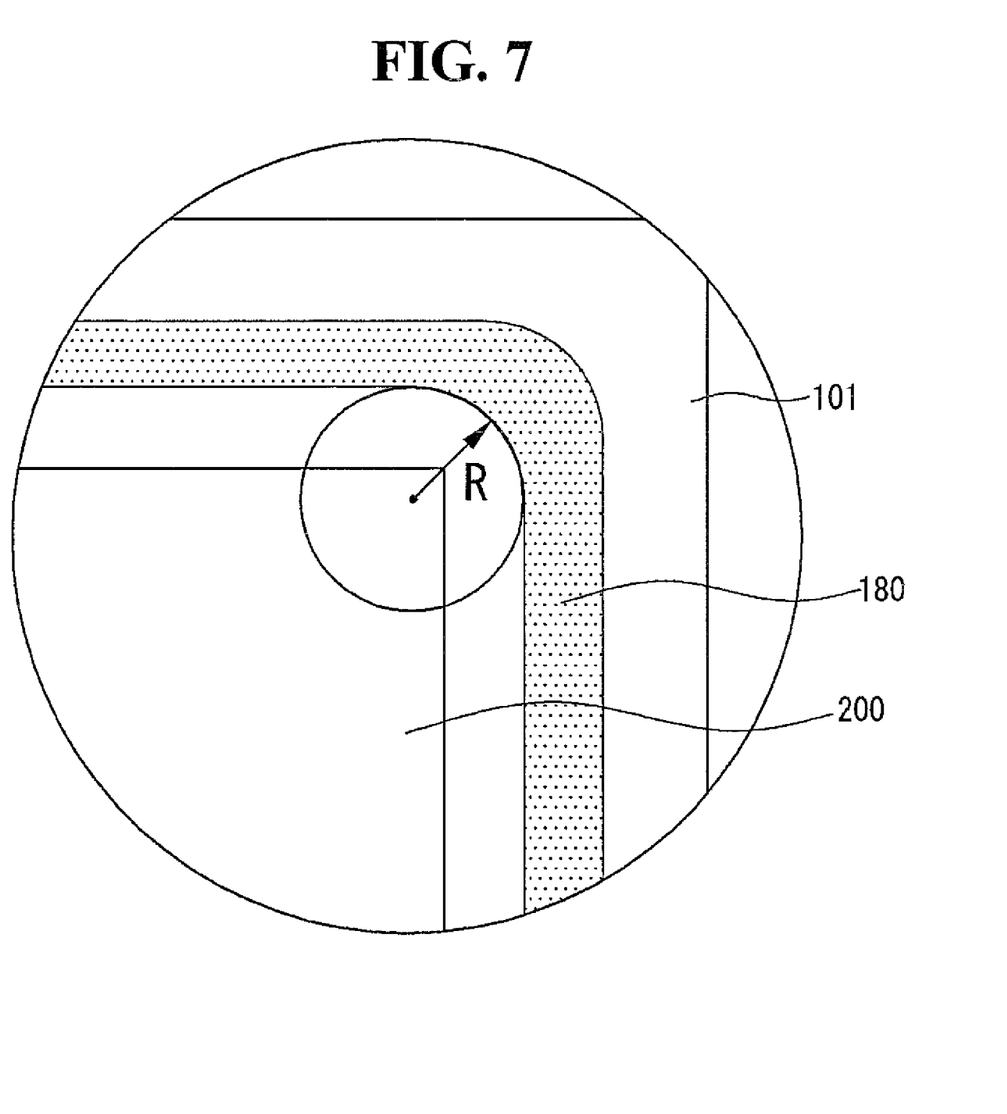
FIGS. 7 and 8 are plane views enlarging an area A of FIG. 2.
Figure 8:
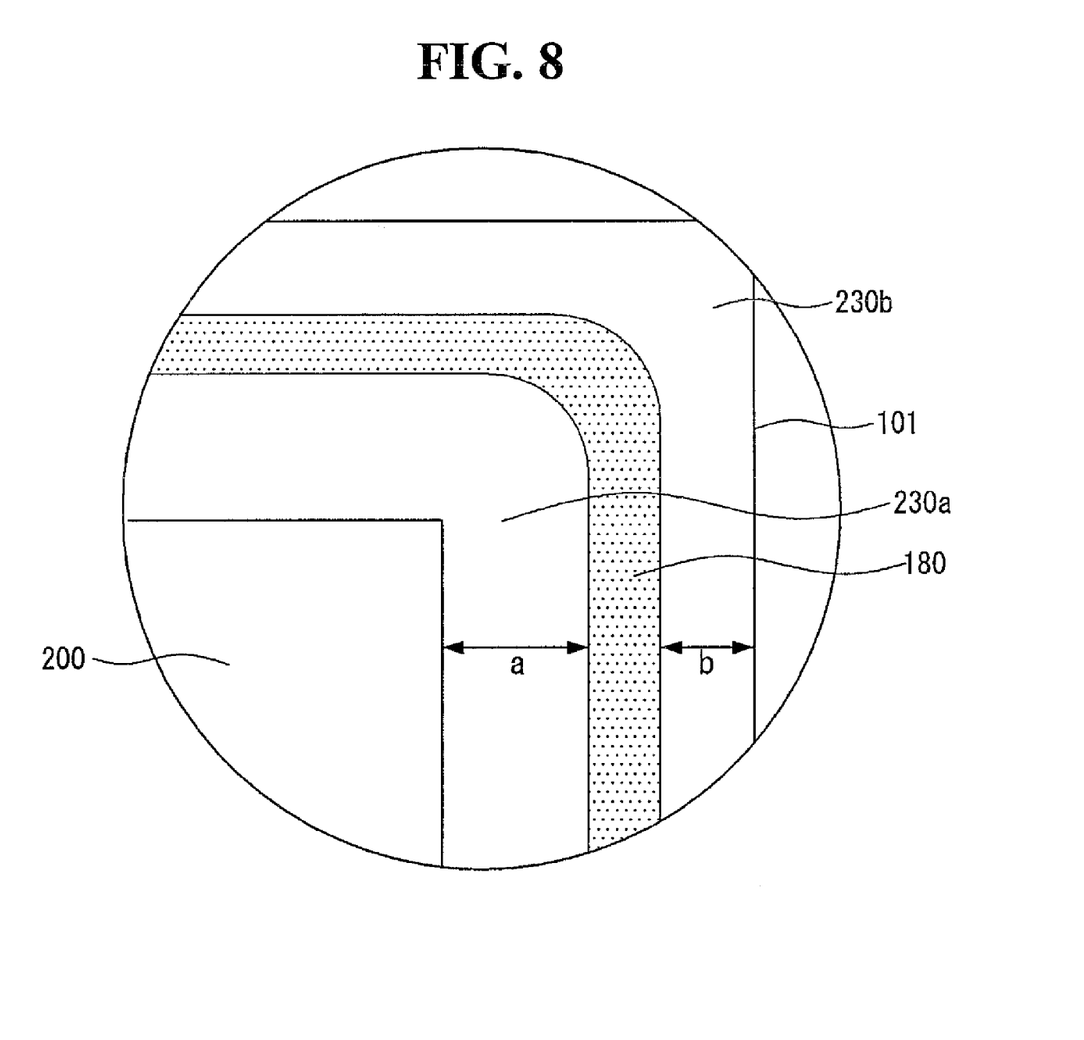

FIGS. 7 and 8 are plane views enlarging an area A of FIG. 2.

As shown in FIG. 7, the seal member 180 is positioned on the first substrate 101 to seal the light emitting unit 200. The seal member 180 may be formed to surround the light emitting unit 200. The seal member 180 may include a straight portion and a curved portion. The straight portion may be formed by coating a surrounding portion of the light emitting unit 200 in a straight shape, and the curved portion may be formed by coating edges of the light emitting unit 200 in a curved shape.

The curved portion of the seal member 180 may be formed to have a radius of curvature (R) of 0.2 mm to 2.5 mm. In case that the radius of curvature (R) of the curved portion is equal to or more 0.2 mm, after the seal member 180 is applied a push-out amount of the seal member 180 can be easily controlled when the first and second substrates 101 and 190 are attached, and a difficult panel scribing problem due to the pushed-out seal member can be solved and/or minimized.

In case that a radius of curvature (R) of the curved portion of the seal member 180 is equal to or less than 2.5 mm, the radius of curvature (R) of the curved portion may increase so that an increase of the bezel area or a decrease of an area of the light emitting unit 200 can be prevented and/or minimized.

As shown in FIG. 8, the light emitting unit 200 is positioned on the first substrate 101. Inside and outside bezel areas 230a and 230b are provided on the first substrate 101. The bezel areas may be considered to be at an outer edge of the light emitting unit 200 and/or around the light emitting unit 200. The seal member 180 for sealing the light emitting unit 200 may be on the inside and outside bezel areas 230a and 230b and/or may be provided at an area between the inside bezel area 230a and the outside bezel area 230b. The outside bezel area 230b may be provided outside the seal member 180 (i.e., outside from the light emitting unit 200), and the inside bezel area 230a may be considered inside the seal member 180 (i.e., adjacent the light emitting unit 200). The bezel area may be divided into the inside bezel area 230a and the outside bezel area 230b by the seal member 180. That is, an area of the light emitting unit 200 becomes the inside bezel area 230a based on the seal member 180, and an area of the first substrate 101 becomes the outside bezel area 230b based on the seal member 180.

The outside bezel area 230b and the inside bezel area 230a may be divided by the seal member 180 in a ratio of 1:1.5.

When the seal member 180 attaches the first substrate 101 to the second substrate 190, the seal member 180 may extend to left and right sides toward the inside bezel area 230a and the outside bezel area 230b, respectively.

A width (a) of the inside bezel area 230a may be greater than a width (b) of the outside bezel area 230b. Hence, a distance between the light emitting unit 200 and the seal member 180 can be secured so as to prevent (or minimize) the seal member 180 from being injected into the light emitting unit 200. Further, this may also minimize a harmful influence on elements inside the light emitting unit 200 when ultraviolet rays are radiated so as to cure the seal member 180 in a sealing process.

When a dispenser for seal member is used, a ratio of the outside bezel area 230b to the inside bezel area 230a may be described by a numerical value as follows. The width (b) of the outside bezel area 230b may be approximately 200 μm and the width (a) of the inside bezel area 230a may be approximately 300 μm, and an error range of the inside bezel area 230a and the outside bezel area 230b may be ±2%. The error range of ±2% may be set in consideration of a process margin that may be generated when each bezel area is formed.

As an example, the width (b) of the outside bezel area 230b may lie substantially in a range between 196 μm and 204 μm as measured from an outer edge of the seal member 180, and the width (a) of the inside bezel area 230a may lie substantially in a range between 294 μm and 306 μm as measured from an inner edge of the seal member 180.

As described above, the display device according to the exemplary embodiment can be manufactured through a simple manufacturing process, and thus the manufacturing yield and the reliability of the display device can be improved.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art.

What is claimed is:

1. A display device comprising:
a first substrate;
a light emitting unit on the first substrate, the light emitting unit including a plurality of unit pixels;
a second substrate opposite to the first substrate, the second substrate sealing the light emitting unit; and
a seal member that attaches the first substrate to the second substrate, the seal member including a straight portion and a curved portion, the seal member is positioned around the light emitting unit,
wherein a radius of curvature of the curved portion of the seal member lies substantially in a range between 0.2 mm and 2.5 mm,
wherein the seal member is a sealant,
wherein the unit pixels include a plurality of subpixels, the subpixels include a first electrode, a light emitting layer, and a second electrode, the unit pixels further include a thin film transistor having a semiconductor layer, a gate electrode, a source electrode, and a drain electrode,
wherein a ratio of a width of the straight portion to a width of the curved portion lies substantially in a range between 1:1 and 1:1.5; and
wherein the seal member is positioned on a bezel area, the bezel area is divided into an outside bezel area and an inside bezel area based on the seal member, and a width of the inside bezel area is greater than a width of the outside bezel area.

2. A display device comprising:
a first substrate;
a light emitting unit on the first substrate, the light emitting unit including a plurality of unit pixels, wherein the unit pixels include a plurality of subpixels, the subpixels include a first electrode, a light emitting layer, and a second electrode, and the unit pixels further include a thin film transistor having a semiconductor layer, a gate electrode, a source electrode, and a drain electrode;

a second substrate opposed to the first substrate;
a sealant that attaches the first substrate to the second substrate, the sealant including a straight portion and a curved portion, the sealant provided around the light emitting unit such that the light emitting unit is sealed in between the first substrate and the second substrate; and
a bezel area that includes an outside bezel area and an inside bezel area separated by the sealant provided on the bezel area, wherein a width of the inside bezel area is greater than a width of the outside bezel area,
wherein a radius of curvature of the curved portion of the sealant is between 0.2 mm and 2.5 mm, and
wherein a ratio of a width of the straight portion to a width of the curved portion is between 1:1 and 1:1.5.

* * * * *